(12) United States Patent
Frougier

(10) Patent No.: US 11,069,819 B2
(45) Date of Patent: Jul. 20, 2021

(54) FIELD-EFFECT TRANSISTORS WITH CHANNEL REGIONS THAT INCLUDE A TWO-DIMENSIONAL MATERIAL ON A MANDREL

(71) Applicant: GLOBALFOUNDRIES U.S. Inc., Santa Clara, CA (US)

(72) Inventor: Julien Frougier, Albany, NY (US)

(73) Assignee: GLOBALFOUNDRIES U.S. INC., Santa Clara, CA (US)

( * ) Notice: Subject to any disclaimer, the term of this patent is extended or adjusted under 35 U.S.C. 154(b) by 75 days.

(21) Appl. No.: 16/668,763

(22) Filed: Oct. 30, 2019

(65) Prior Publication Data

US 2021/0135015 A1  May 6, 2021

(51) Int. Cl.
| | |
|---|---|
| H01L 29/778 | (2006.01) |
| H01L 29/786 | (2006.01) |
| H01L 29/06 | (2006.01) |
| H01L 29/24 | (2006.01) |
| H01L 29/66 | (2006.01) |
| H01L 21/02 | (2006.01) |
| H01L 29/423 | (2006.01) |

(Continued)

(52) U.S. Cl.
CPC .. *H01L 29/78696* (2013.01); *H01L 21/02568* (2013.01); *H01L 21/02603* (2013.01); *H01L 21/823412* (2013.01); *H01L 29/0673* (2013.01); *H01L 29/1037* (2013.01); *H01L 29/24* (2013.01); *H01L 29/42392* (2013.01); *H01L 29/66431* (2013.01); *H01L 29/66787* (2013.01); *H01L 29/66969* (2013.01); *H01L 29/7789* (2013.01); *H01L 29/78618* (2013.01)

(58) Field of Classification Search
CPC ......... H01L 21/02568; H01L 21/02587; H01L 21/823412; H01L 21/823418; H01L 21/823437; H01L 29/0665; H01L 29/1037; H01L 29/24; H01L 29/42376; H01L 29/42392; H01L 29/66431; H01L 29/66787; H01L 29/66969; H01L 29/7789; H01L 29/785; H01L 2029/7858; H01L 29/78696
See application file for complete search history.

(56) References Cited

U.S. PATENT DOCUMENTS

| | | |
|---|---|---|
| 10,134,915 B2 | 11/2018 | Colinge et al. |
| 10,388,732 B1 | 8/2019 | Frougier et al. |

(Continued)

OTHER PUBLICATIONS

Frougier et al., "Fin-Type Field-Effect Transistors Including a Two-Dimensional Material", filed Jul. 19, 2019 as U.S. Appl. No. 16/516,623.

(Continued)

*Primary Examiner* — Stephen W Smoot
(74) *Attorney, Agent, or Firm* — Thompson Hine LLP; Francois Pagette

(57) ABSTRACT

Structures for a field-effect transistor and methods of forming structures for a field-effect transistor. A gate electrode has a section that is wrapped about a first side surface and a second side surface of a mandrel that is composed of a dielectric material. A channel layer has a channel region that is positioned in part between the first side surface of the mandrel and the section of the gate electrode. The channel layer is composed of a two-dimensional material.

20 Claims, 22 Drawing Sheets

(51) Int. Cl.
*H01L 29/10* (2006.01)
*H01L 21/8234* (2006.01)

(56) References Cited

U.S. PATENT DOCUMENTS

| | | | | |
|---|---|---|---|---|
| 2015/0041873 A1* | 2/2015 | Karda | ...................... | H01L 29/24 |
| | | | | 257/295 |
| 2016/0093745 A1* | 3/2016 | Diaz | ................... | H01L 29/0657 |
| | | | | 257/29 |
| 2016/0293441 A1* | 10/2016 | Lee | ...................... | H01L 21/0332 |
| 2017/0317206 A1 | 11/2017 | van Dal et al. | | |
| 2018/0182898 A1 | 6/2018 | Moroz et al. | | |
| 2019/0074381 A1* | 3/2019 | Park | ...................... | H01L 29/0665 |
| 2019/0088717 A1* | 3/2019 | Yeh | ........................ | H01L 27/249 |
| 2020/0388685 A1* | 12/2020 | Sharma | ................. | H01L 29/785 |

OTHER PUBLICATIONS

Chen et al., "Stable few-layer MoS2 rectifying diodes formed by plasma-assisted doping", Applied Physics Letters 103, 142110 (2013).

Wi et al., "Enhancement of Photovoltaic Response in Multilayer MoS2 Induced by Plasma Doping" © 2014 American Chemical Society, vol. 8, No. 5, 5270-5281.

Nipane et al., "Few-Layer MoS2 p-Type Devices Enabled by Selective Doping Using Low Energy Phosphorus Implantation", © 2016 American Chemical Society, ACS Nano 2016, 10, 2128-2137.

* cited by examiner

FIELD-EFFECT TRANSISTORS WITH CHANNEL REGIONS THAT INCLUDE A TWO-DIMENSIONAL MATERIAL ON A MANDREL

BACKGROUND

The present invention relates to semiconductor device fabrication and integrated circuits and, more specifically, to structures for a field-effect transistor and methods of forming a structure for a field-effect transistor.

Complementary-metal-oxide-semiconductor (CMOS) processes may be used to build p-type and n-type field-effect transistors that are used to construct, for example, logic cells. Field-effect transistors generally include a channel region located in a semiconductor body, a source, a drain, and a gate electrode over the body. When a control voltage exceeding a characteristic threshold voltage is applied to the gate electrode, carrier flow occurs in the channel region between the source and drain to produce a device output current.

Nanosheet field-effect transistors represent a type of non-planar field-effect transistor that may be fabricated with an increased packing density in an integrated circuit. A nanosheet field-effect transistor includes multiple nanosheet channel layers that are arranged in a patterned layer stack over a top surface of a substrate and source/drain regions that are connected with the lateral ends of the nanosheet channel layers. The nanosheet channel layers are initially arranged in the patterned layer stack with sacrificial layers containing a material (e.g., silicon-germanium) that alternate with the nanosheet channel layers and that can be etched selectively to the material (e.g., silicon) constituting the nanosheet channel layers. The source/drain regions may be formed by epitaxially growing semiconductor material from the lateral ends of the nanosheet channel layers. The sacrificial layers are etched and removed in order to release the nanosheet channel layers and to provide spaces for the formation of a gate electrode. Sections of the gate electrode may surround all sides of the individual nanosheet channel layers in a gate-all-around arrangement. During operation with a control voltage applied to the gate electrode, the horizontal flow of carriers in the nanosheet channel layers produces the device output current.

Nanosheet field-effect transistors may encounter difficulty in scaling because reductions in the nanosheet thickness eventually reach a point at which quantum confinement significantly degrades performance. In addition, short channel effects may limit the ability to continue to shrink the gate length. As such, limits over electrostatic control for nanosheet field-effect transistors may limit scaling.

Improved structures for a field-effect transistor and methods of forming a structure for a field-effect transistor are needed.

SUMMARY

In embodiments of the invention, a structure is provided for a field-effect transistor. The structure includes a mandrel composed of a dielectric material and a gate electrode having a section wrapped about a first side surface and a second side surface of the mandrel. The structure further includes a channel layer having a channel region that is positioned in part between the first side surface of the mandrel and the section of the gate electrode. The channel layer is composed of a two-dimensional material.

In embodiments of the invention, a method is provided for forming a field-effect transistor. The method includes forming a channel layer including a channel region, forming a dielectric mandrel that includes a first side surface and a second side surface, and forming a gate electrode that has a section wrapped about the first side surface and the second side surface of the dielectric mandrel. The channel layer is composed of a two-dimensional material. The channel region of the channel layer is positioned in part between the first side surface of the dielectric mandrel and the section of the gate electrode.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention. In the drawings, like reference numerals refer to like features in the various views.

DETAILED DESCRIPTION

Figure 1:
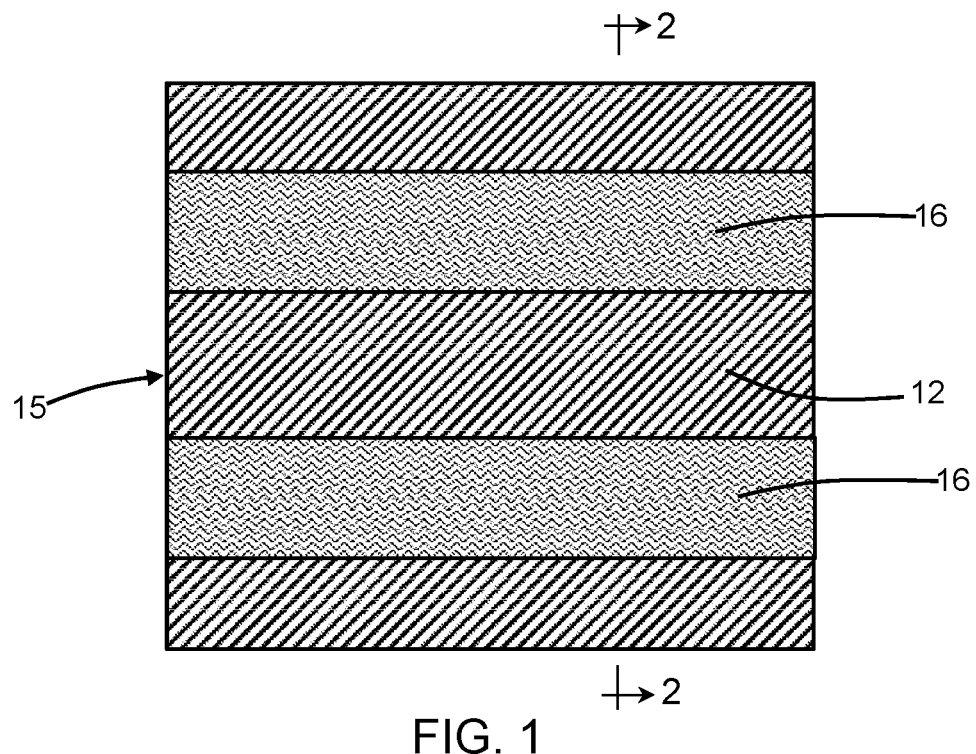
FIG. 1 is a top view of a device structure at an initial fabrication stage of a processing method in accordance with embodiments of the invention.
Figure 2:
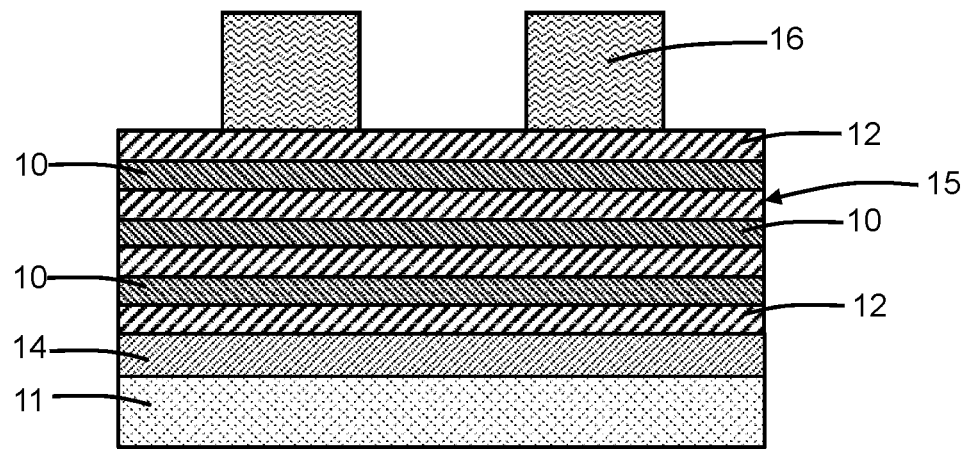
FIG. 2 is a cross-sectional view taken generally along line 2-2 in FIG. 1.

With reference to FIGS. 1, 2 and in accordance with embodiments of the invention, one or more nanosheet channel layers 10, one or more sacrificial layers 12, and a sacrificial layer 14 are arranged in a layer stack 15 that is located on a substrate 11. The sacrificial layer 14 is arranged in a vertical direction between the substrate 11 and the lowermost sacrificial layer 12. The substrate 11 may be composed of a single-crystal semiconductor material, such as single-crystal silicon. The nanosheet channel layers 10, the sacrificial layers 12, and the sacrificial layer 14 may be formed on the substrate 11 by an epitaxial growth process during which the layer composition is alternated through variation of the reactants supplied to the deposition tool. The number of nanosheet channel layers 10 and sacrificial layers 12 in the layer stack 15 may differ from the number in the representative embodiment. In particular, the number of nanosheet channel layers 10 and sacrificial layers 12 in the layer stack 15 may be greater than the number in the representative embodiment through the addition of pairs of nanosheet channel layers 10 and sacrificial layers 12 to the layer stack 15.

The nanosheet channel layers 10 are composed of a single-crystal semiconductor material, and the sacrificial layers 12 are composed of a single-crystal semiconductor material with a composition that is selected to be removed selective to the single-crystal semiconductor material of the nanosheet channel layers 10. The sacrificial layer 14 is composed of a single-crystal semiconductor material with a composition that is selected to be removed selective to the single-crystal semiconductor materials of both the nanosheet channel layers 10 and sacrificial layers 12. As used herein, the term "selective" in reference to a material removal process (e.g., etching) denotes that, with an appropriate etchant choice, the material removal rate (i.e., etch rate) for the targeted material is greater than the removal rate for at least another material exposed to the material removal process.

In an embodiment, the semiconductor material constituting the nanosheet channel layers 10 may be single-crystal silicon, the semiconductor material constituting the sacrificial layers 12 may be single-crystal silicon-germanium that etches at a higher rate than silicon due to its germanium content, and the semiconductor material constituting the sacrificial layer 14 may be silicon-germanium that etches at a higher rate than the sacrificial layers 12 due to containing a higher germanium content than the sacrificial layers 12. In an embodiment, the nanosheet channel layers 10 are free of germanium, the germanium content of the sacrificial layers 12 may range from fifteen atomic percent (15 at. %) to thirty-five atomic percent (35 at. %), and the germanium content of the sacrificial layer 14 may range from fifty atomic percent (50 at. %) to seventy-five atomic percent (75 at. %).

A hardmask 16 is deposited over the layer stack 15 and then patterned by lithography and etching processes. Sections of the hardmask 16 cover portions of the layer stack 15. The hardmask 16 may be composed of a dielectric material, such as silicon nitride, that is deposited by chemical vapor deposition (CVD).

Figure 3:
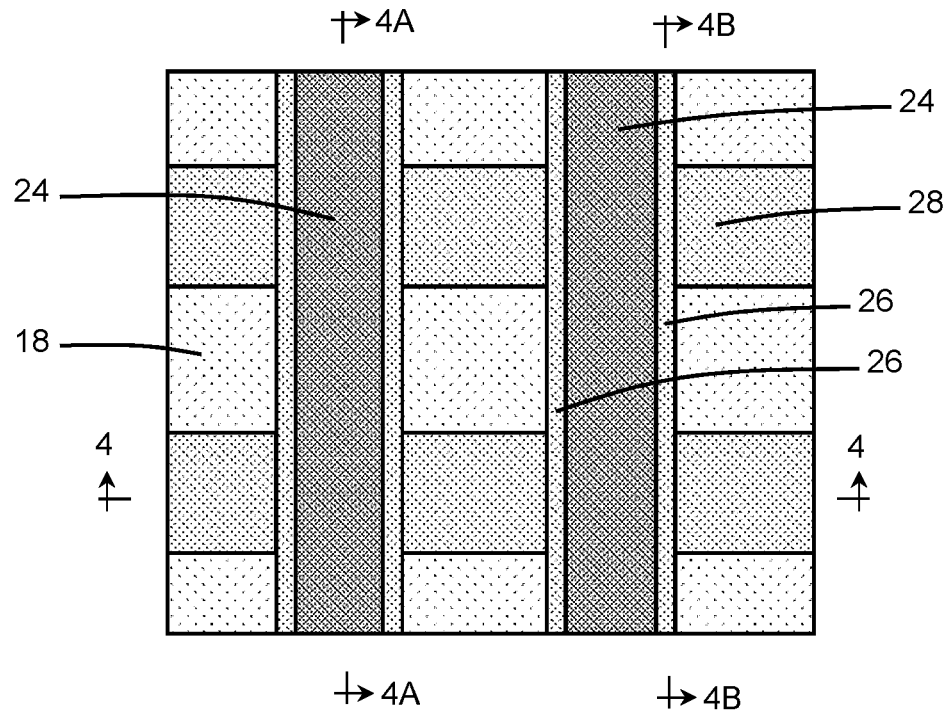
FIG. 3 is a top view of the device structure at a fabrication stage subsequent to FIG. 1.
Figure 4:
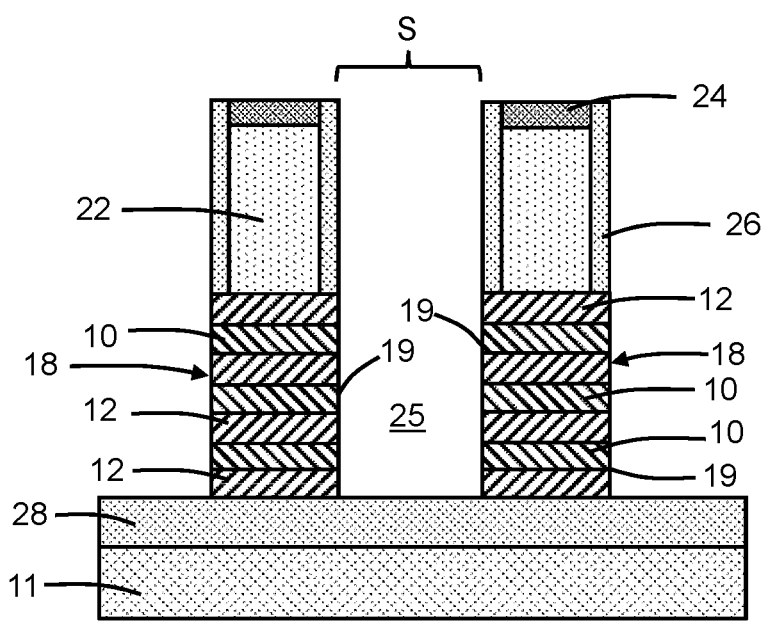
FIG. 4 is a cross-sectional view taken generally along line 4-4 in FIG. 3.
Figure 4A:
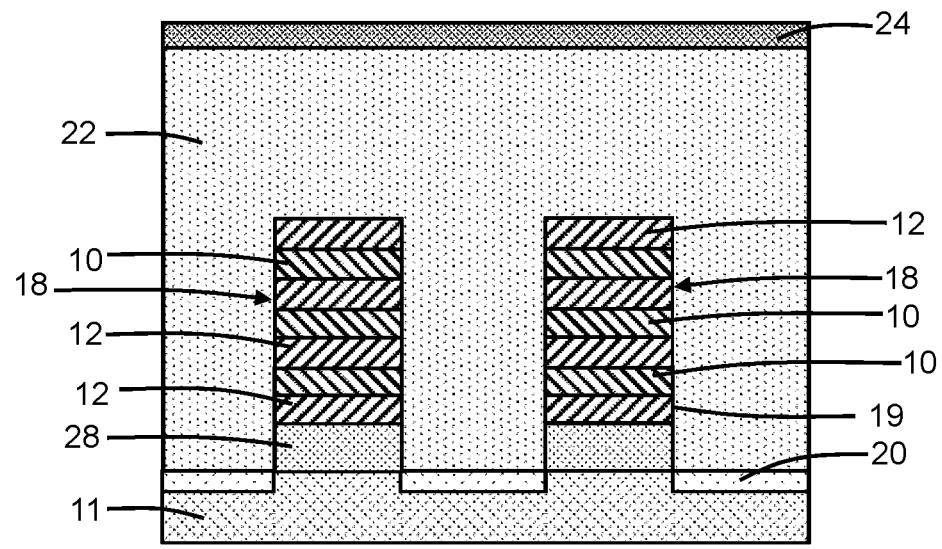
FIG. 4A is a cross-sectional view taken generally along line 4A-4A in FIG. 3.
Figure 4B:
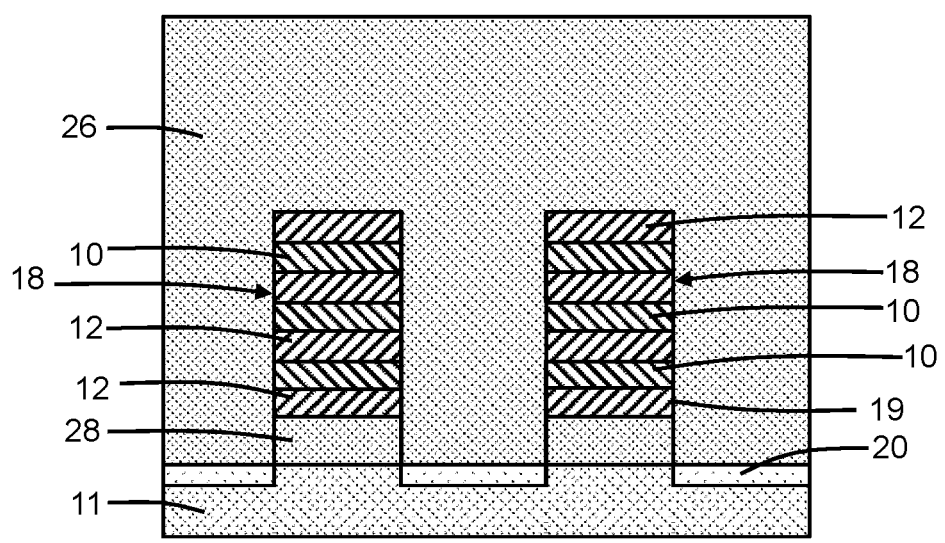
FIG. 4B is a cross-sectional view taken generally along line 4B-4B in FIG. 3.

With reference to FIGS. 3, 4A, 4B in which like reference numerals refer to like features in FIGS. 1, 2 and at a subsequent fabrication stage, the nanosheet channel layers 10, sacrificial layers 12, and sacrificial layer 14 are patterned with an etching process, such as an anisotropic etching process like reactive ion etching, to define fins 18. The prior patterning of the sections of the hardmask 16 establishes the pattern for the fins 18.

The substrate 11 may be etched by the etching process and, in particular, self-aligned trenches may be defined in the substrate 11 between adjacent sidewalls 19 of the fins 18. Shallow trench isolation regions 20 are subsequently formed in the trenches between the adjacent sidewalls 19 of the fins 18 by depositing a layer composed of a dielectric material, such as silicon dioxide, in the trenches, and recessing the deposited layer with an etching process.

Sacrificial gate structures 22 are formed that overlap with, and wrap about, a portion of each fin 18. The term "sacrificial gate structure" as used herein refers to a placeholder structure for a gate structure to be subsequently formed. The sacrificial gate structures 22 have a spaced-apart arrangement along the length of the fins 18 and are aligned transverse to the longitudinal axes of the fins 18. The sacrificial gate structures 22 may include a thin oxide layer coating the exterior surfaces of the fins 18 and a thicker layer containing a sacrificial material, such as amorphous silicon. The sacrificial gate structures 22 may be patterned by lithography and etching processes from these constituent layers with reactive ion etching (RIE) using a hardmask. The sacrificial gate structures 22 are each covered by a hardmask cap 24. The hardmask cap 24, which contain a dielectric material such as silicon nitride, may be a remnant of the hardmask from the lithography and etching processes used to pattern the sacrificial gate structures 22.

The sacrificial layer 14 may be removed from each fin 18 by a selective etching process to create spaces beneath the fins 18. As used herein, the term "selective" in reference to a material removal process (e.g., etching) denotes that, with an appropriate etchant choice, the material removal rate (i.e., etch rate) for the targeted material is greater than the removal rate for at least another material exposed to the material removal process. Sidewall spacers 26 may then be formed adjacent to the sidewalls of the sacrificial gate structures 22. The sidewall spacers 26 may be formed by depositing a conformal layer composed of a dielectric material, such as a low-k dielectric material (e.g., SiBCN, SiOC, or SiOCN), and etching the deposited conformal layer with an anisotropic etching process, such as reactive ion etching. Portions of the deposited conformal layer fill the spaces generated by the removal of the patterned sections of the sacrificial layer 14 to define a bottom dielectric isolation layer 28 below the fins 18.

Recesses 25 may be formed in the fins 18 by an etching process that is self-aligned by the sidewall spacers 26 and sacrificial gate structures 22. The etching process may stop on the bottom dielectric isolation layer 28. Each of the fins 18 includes sidewalls 19 adjacent to the recesses, and adjacent sidewalls 19 of the fins 18 are separated by a gap of dimension, S.

Figure 5:
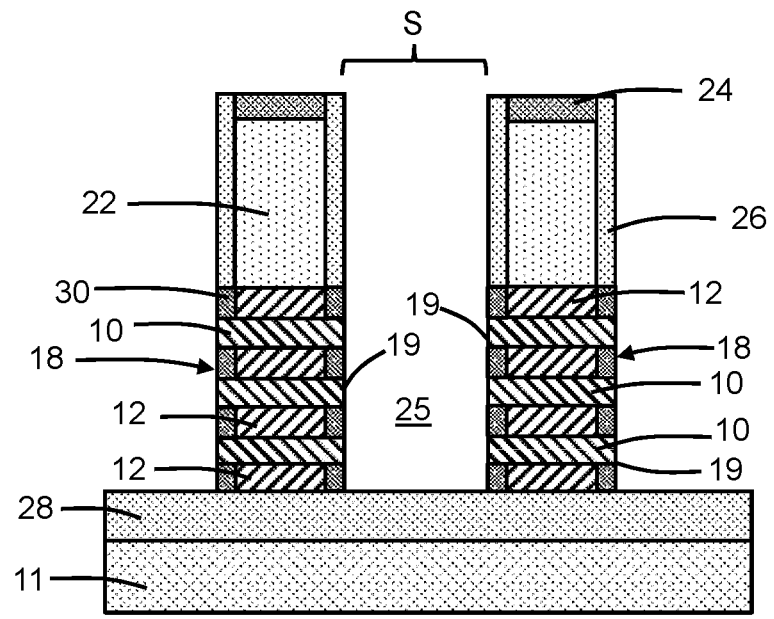
FIGS. 5-10, 5A-10A, and 5B-10B are respective cross-sectional views of the device structure at successive fabrication stages of the processing method subsequent to FIGS. 4, 4A, 4B.
Figure 5A:
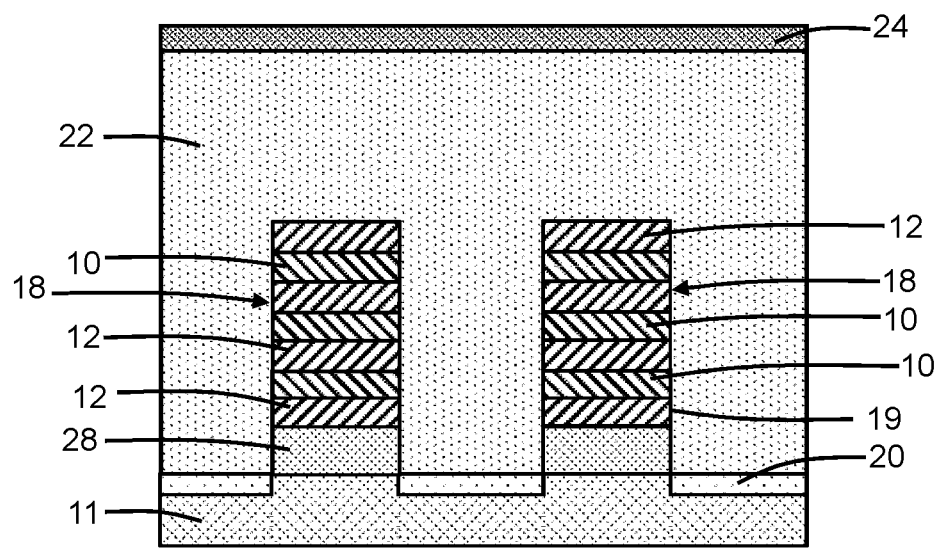
Figure 5B:
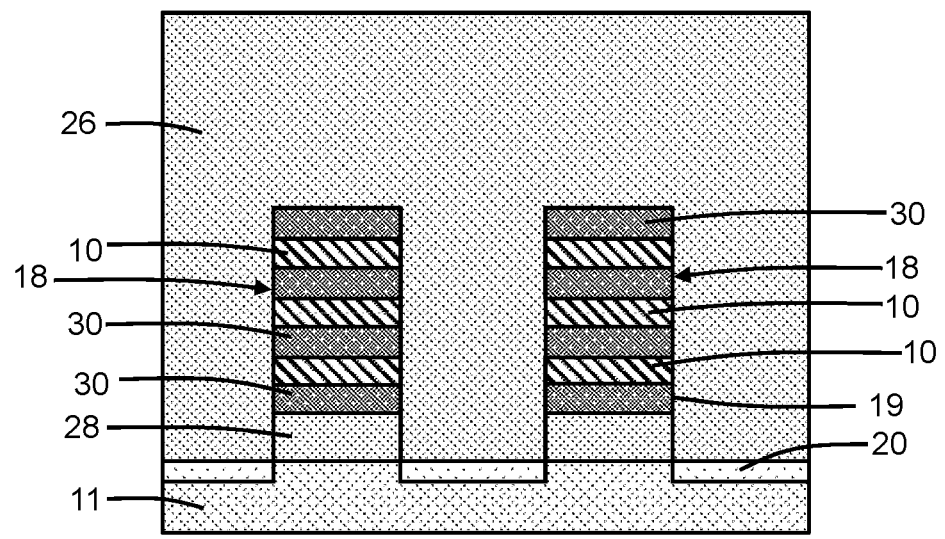

With reference to FIGS. 5, 5A, 5B in which like reference numerals refer to like features in FIGS. 4, 4A, 4B and at a subsequent fabrication stage, the sacrificial layers 12 are recessed with an etching process that removes the material of the sacrificial layers 12 selective to the material of the nanosheet channel layers 10. Inner spacers 30 are formed by depositing a conformal layer of dielectric material, such as silicon nitride, that fills the recesses adjacent to the opposite ends of the recessed sacrificial layers 12 and then performing an anisotropic etching process to remove the conformal layer from outside of the recesses.

Figure 6:
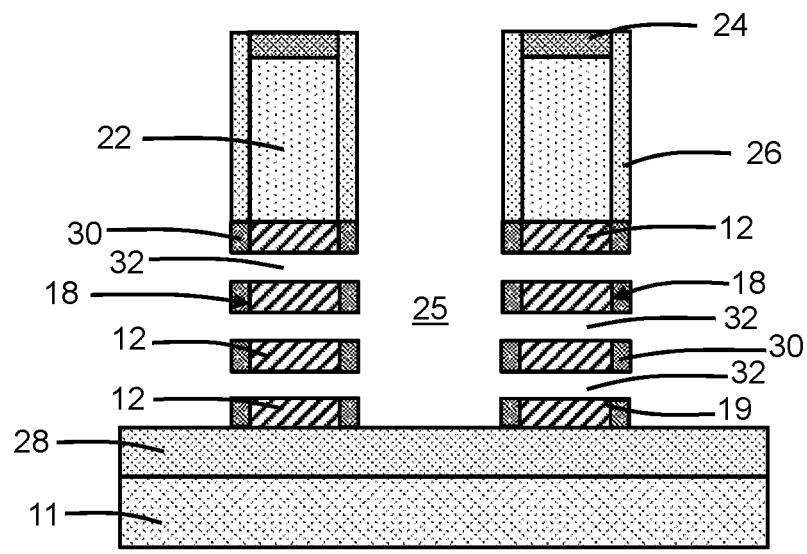
Figure 6A:
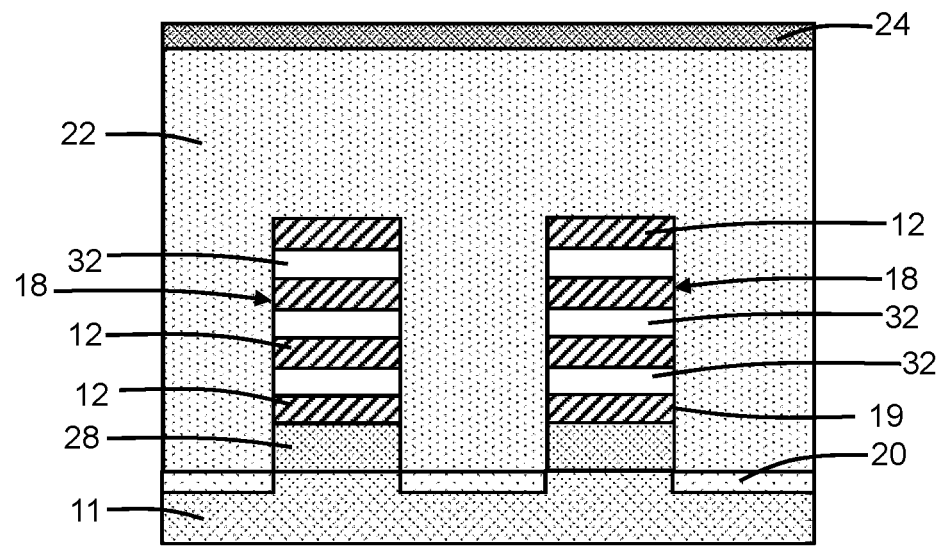
Figure 6B:
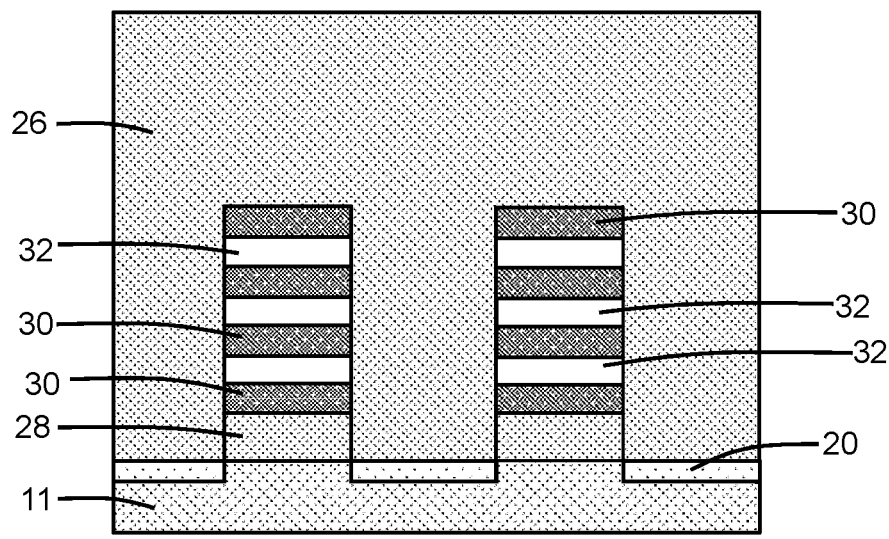

With reference to FIGS. 6, 6A, 6B in which like reference numerals refer to like features in FIGS. 5, 5A, 5B and at a subsequent fabrication stage, the nanosheet channel layers 10 are fully removed with an etching process to form spaces 32 that extend across the full width of the sacrificial layers 12 and sidewall spacers 26. For example, the etching process may be a remote plasma-assisted dry etch process (e.g., a Frontier etch) that exposes the nanosheet channel layers 10 to radicals (i.e., uncharged or neutral species) generated from a gas mixture of nitrogen triflouride ($NF_3$) and hydrogen ($H_2$). In conventional processes, the nanosheet channel layers 10 are not sacrificial and would be found in the final device structure.

Figure 7:
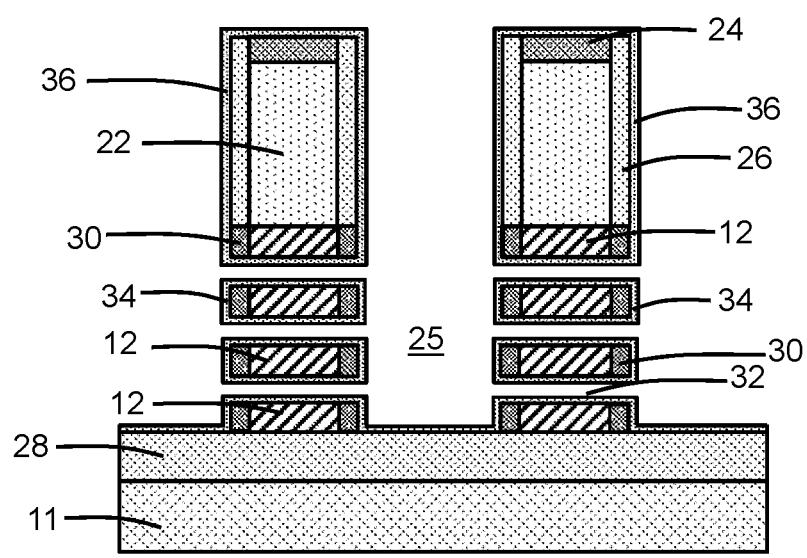
Figure 7A:
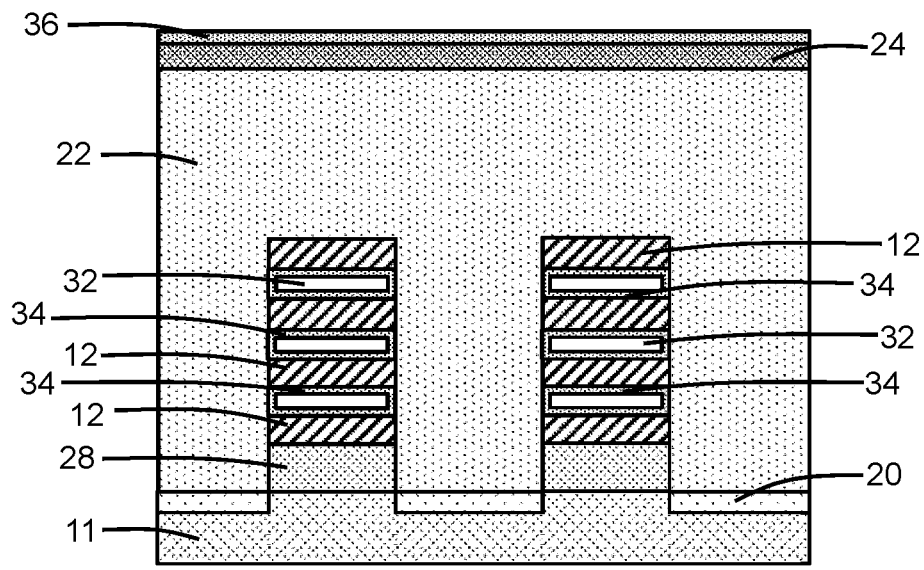
Figure 7B:
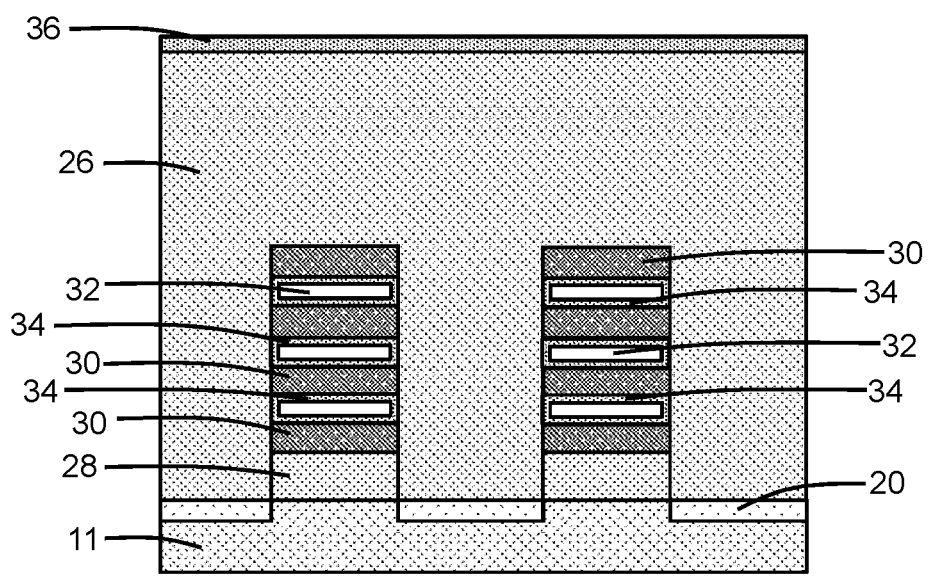

With reference to FIGS. 7, 7A, 7B in which like reference numerals refer to like features in FIGS. 6, 6A, 6B and at a subsequent fabrication stage, a two-dimensional (2D) material is conformally deposited that partially fills each of the spaces 32 with replacement channel layers 34 and that forms a layer 36 that wraps about the sidewall spacers 26 and the hardmask cap 24. The two-dimensional material also deposits on the bottom dielectric isolation layer 28. The replacement channel layer 34 only partially fills each space 32 with the two-dimensional material. The replacement channel layer 34 and the layer 36 define a continuous thin film composed of the two-dimensional material.

The two-dimensional material forming the replacement channel layers 34 and layer 36 may be a thin conformal coating that is deposited by, for example, atomic layer deposition or chemical vapor deposition. Restrictions on the deposition temperature are reduced because the deposition is occurring in the process flow before forming the metal gate structures that replace the sacrificial gate structures 22. In an embodiment, the two-dimensional material may be characterized by a carrier mobility that is greater than the carrier mobility of silicon. In an embodiment, the two-dimensional material may be composed of a transition metal dichalcogenide that includes a transition metal (e.g., molybdenum (Mo) or tungsten (W)) and a chalcogen atom (sulphur (S), selenium (Se), or tellurium (Te)). Exemplary transition metal dichalcogenides include, but are not limited to, molybdenum disulphide ($MoS_2$), hafnium disulfide ($HfS_2$), zirconium disulfide ($ZrS_2$), tungsten disulfide ($WS_2$), tin sulfide (SnS), and tungsten diselenide ($WSe_2$). In an alternative embodiment, the two-dimensional material may be composed of graphene (C). In an embodiment, the two-dimensional material and, in particular, the two-dimensional material contained in each of the replacement channel layers 34 may include a single monolayer of atoms arranged in a thin sheet. In an alternative embodiment, each replacement channel layer 34 may contain one monolayer to two monolayers of the two-dimensional material. In an alternative embodiment, each replacement channel layer 34 may contain two or more monolayers of the two-dimensional material.

Figure 8:
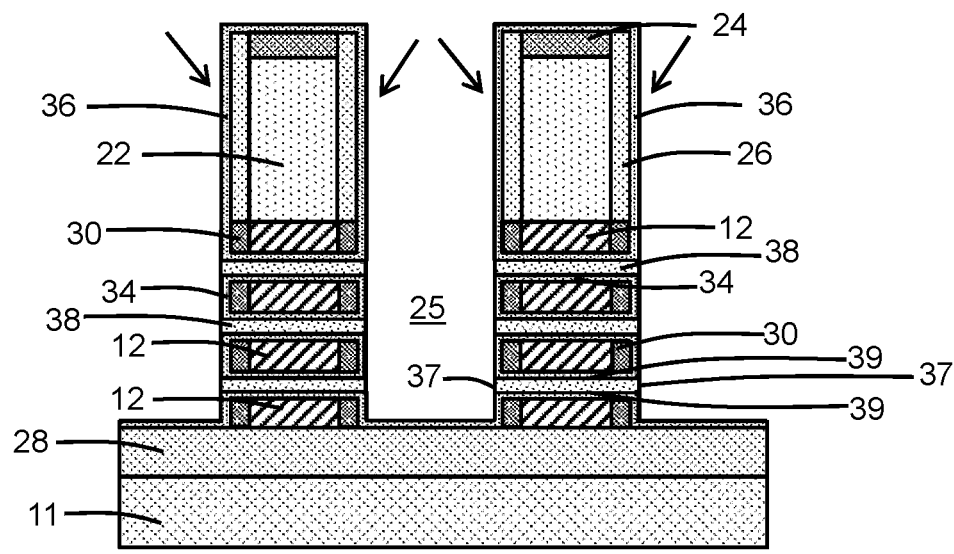
Figure 8A:
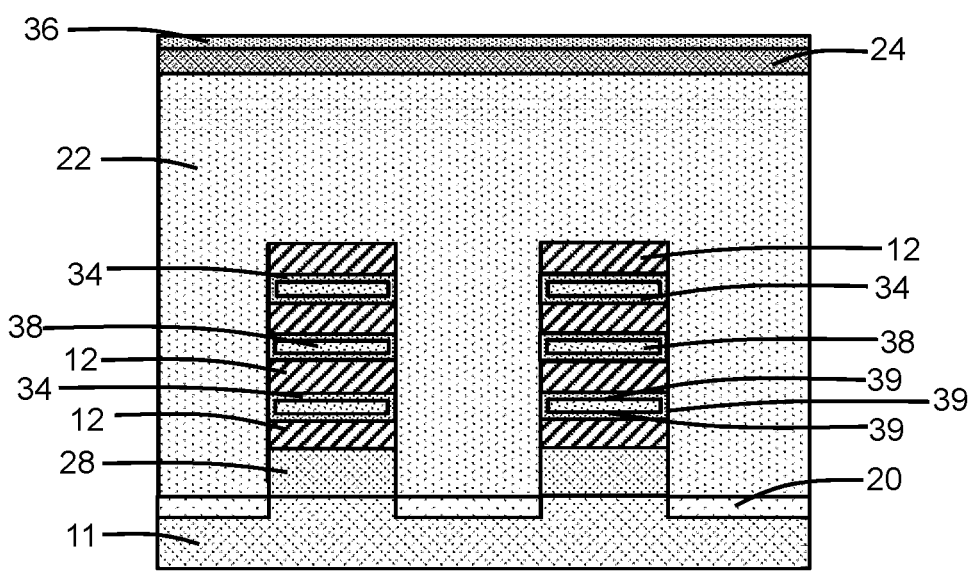
Figure 8B:
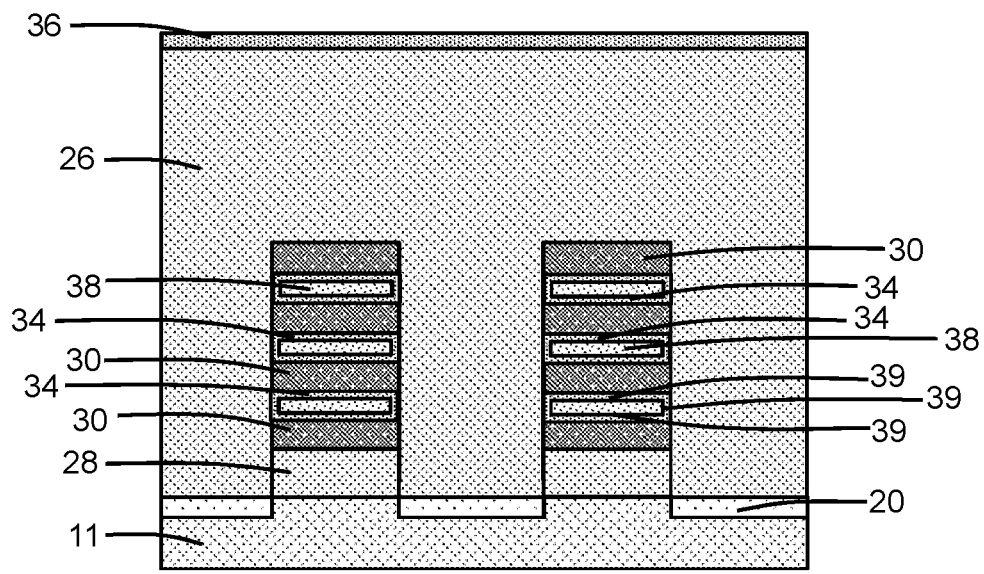

With reference to FIGS. 8, 8A, 8B in which like reference numerals refer to like features in FIGS. 7, 7A, 7B and at a subsequent fabrication stage, mandrels 38 are formed that fill the remainder of each space 32 that is not occupied by the replacement channel layers 34. The mandrels 38 may be composed of a dielectric material, such as a low-k dielectric material (e.g., SiBCN, SiOC, or SiOCN), deposited as layer by atomic layer deposition and etched with an isotropic etching process to remove portions of the layer external to the spaces 32. The deposited layer may pinch-off inside the spaces 32 to form the mandrels 38. The mandrels 38 are formed after the replacement channel layers 34 and layer 36 are formed. The mandrels 38 have a stacked arrangement that is established by the spaces 32 and replacement channel layers 34.

Each mandrel 38 includes opposite end surfaces 37 that are spaced in a lateral direction relative to each other and side surfaces 39 that are positioned between the opposite end surfaces 37. The side surfaces 39 are arranged about the circumference of each mandrel 38. One of the side surfaces 39 of each mandrel 38 is an upper side surface that is positioned furthest (i.e., remote) from the substrate 11, and another of the side surfaces 39 of each mandrel 38 is a lower side surface that is positioned closest (i.e., proximate) to the substrate 11. The upper and lower side surfaces 39 of each mandrel 38 may be contained in parallel or substantially parallel planes. In an embodiment, each mandrel 38 may be rectangular in cross section parallel to its longitudinal axis. The two-dimensional material in each replacement channel layer 34 is wrapped about (i.e., surrounds or extends fully about) all of the side surfaces 39 of one of the mandrels 38 and, as a result, is positioned on the upper and lower side surfaces 39 as well as all other side surfaces 39. In an embodiment, the two-dimensional material in each replacement channel layer 34 is in direct contact with the side surfaces 39 of one of the mandrels 38. The opposite end surfaces 37 of each mandrel 38 are not covered by the two-dimensional material.

The two-dimensional material in the layer 36 may be doped, as diagrammatically indicated by the single-headed arrows labeled with reference numeral 35 in FIG. 8, to increase its electrical conductivity. In an embodiment, the two-dimensional material in the layer 36 may be doped following its deposition and after the mandrels 38 are formed. In an embodiment, the two-dimensional material in the layer 36 may be doped by a non-damaging doping process, such as by a plasma doping process. In an embodiment, the two-dimensional material in the layer 36 may be doped with a p-type dopant that provides p-type electrical conductivity. In an alternative embodiment, the two-dimensional material in the layer 36 may be doped with an n-type dopant that provides n-type electrical conductivity. The replacement channel layers 34 are masked and not doped by the process doping the layer 36.

Figure 9:
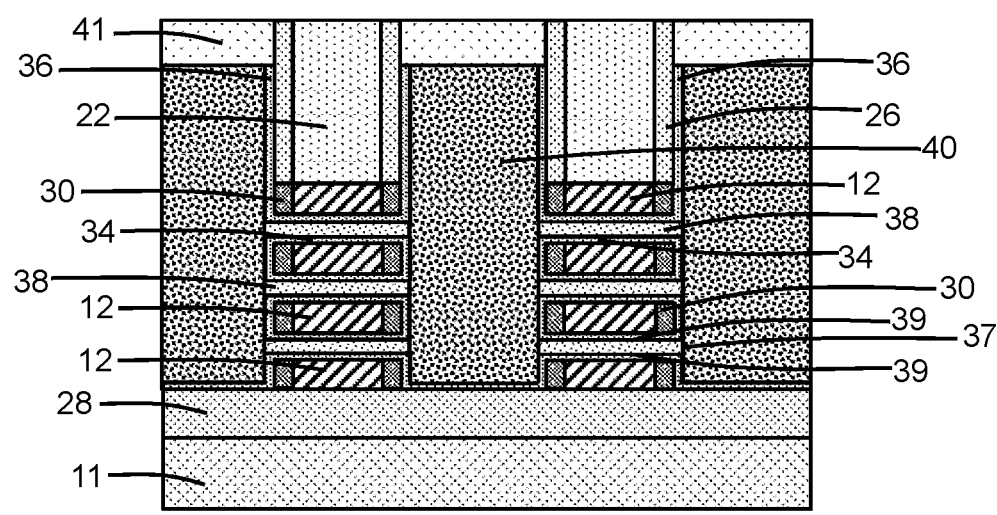
Figure 9A:
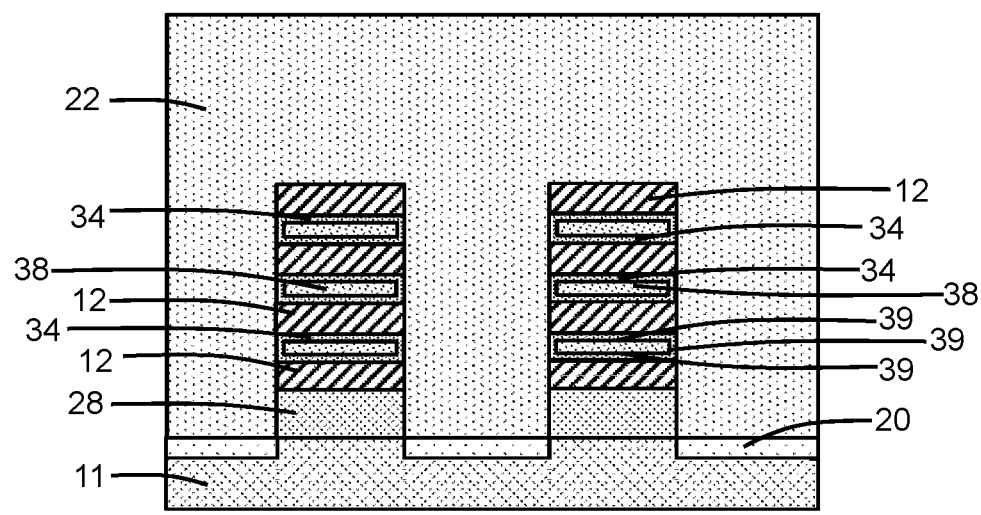
Figure 9B:
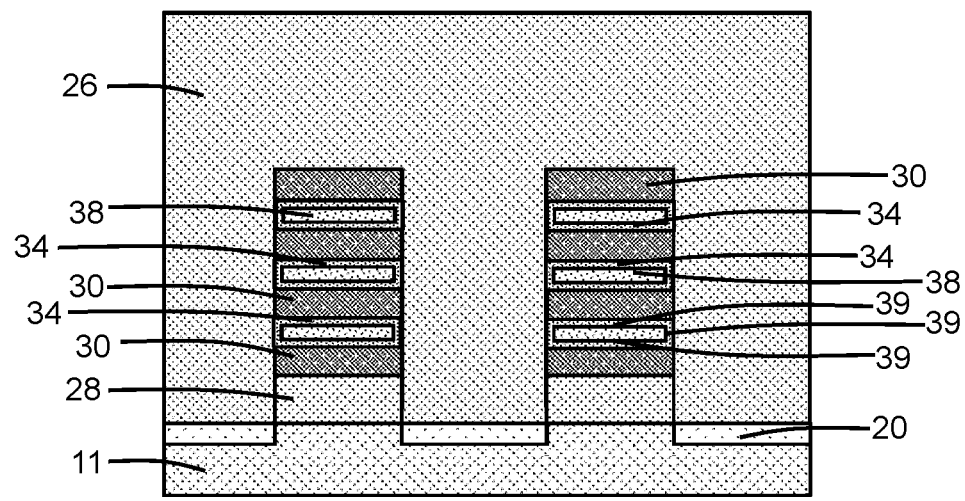

With reference to FIGS. 9, 9A, 9B in which like reference numerals refer to like features in FIGS. 8, 8A, 8B and at a subsequent fabrication stage, source/drain contacts 40 are formed in the recesses 25. The source/drain contacts 40 are coupled by the layer 36 with the two-dimensional material of the replacement channel layers 34. The source/drain contacts 40 may be composed of a metal, such as tungsten or titanium nitride, that is deposited and recessed with an etch-back process. The two-dimensional material in the layer 36, which may be doped, wraps around each source/drain contact 40. This relationship maximizes the contact area, which may reduce the contact resistance.

The replacement channel layers 34 in each fin 18 are laterally arranged between different source/drain contacts 40, and are coupled to these different source/drain contacts 40. The mandrels 38 extend in a lateral direction fully across each fin 18 from one of the source/drain contacts 40 to another of the source/drain contacts 40, and the opposite end surfaces 37 of each mandrel 38 terminate at, and directly contact, one of the source/drain contacts 40. The end surfaces 37 of each mandrel 38 are free of the two-dimensional material, which facilitates the direct contact and electrical isolation of the different replacement channel layers 34 in each fin 18.

The layer 36 may be chamfered, after forming the source/drain contacts 40, using an isotropic etching process such that the different source/drain contacts 40 are disconnected from each other. The height of the source/drain contacts 40 may determine the degree of chamfering of the layer 36.

An interlayer dielectric layer 41 is deposited and planarized to fill the spaces over the source/drain contacts 40. The interlayer dielectric layer 41 may be composed of a dielectric material, such as silicon dioxide, deposited by chemical vapor deposition and may be planarized by chemical-mechanical polishing. The planarization may remove the hardmask caps 24, which opens the sacrificial gate structures 22 for subsequent removal.

Figure 10:
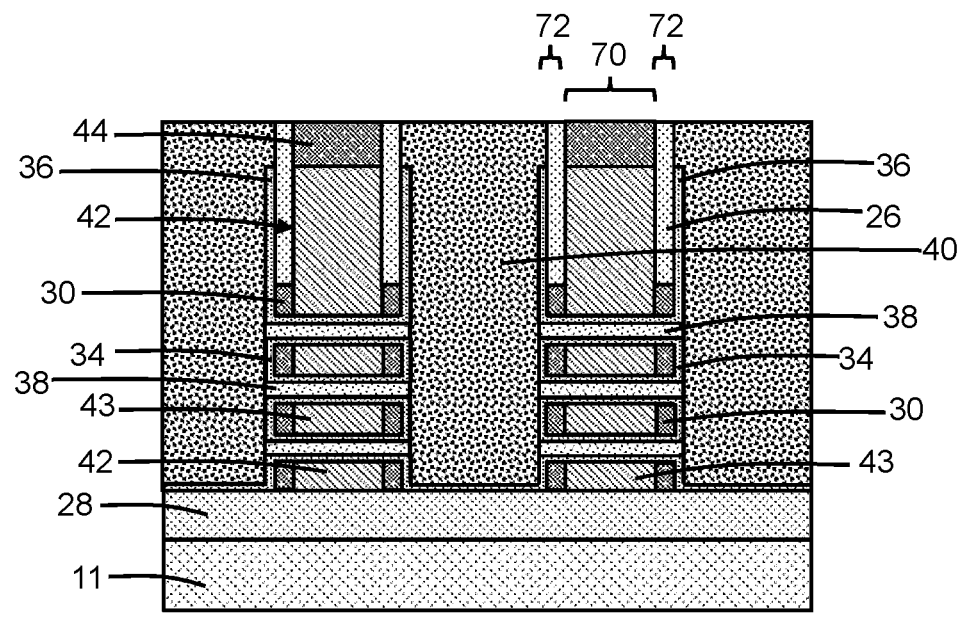
Figure 10A:
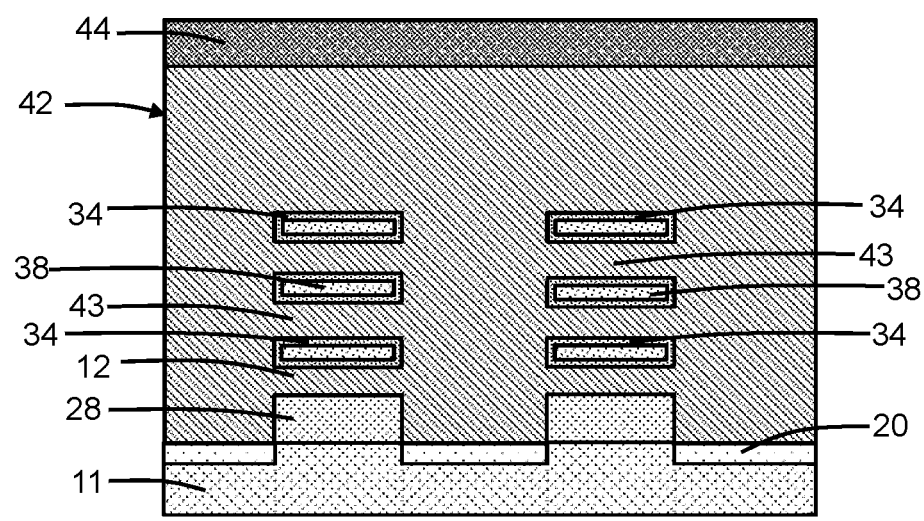
Figure 10B:
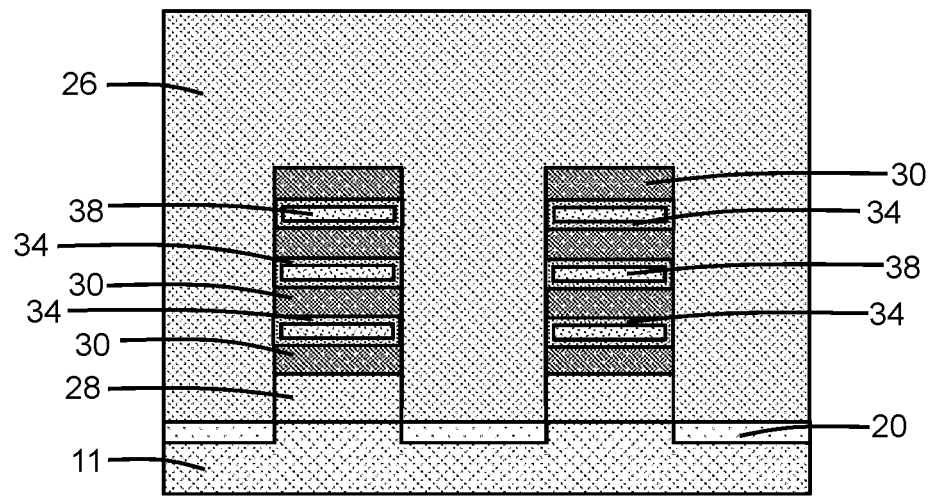

With reference to FIGS. 10, 10A, 10B in which like reference numerals refer to like features in FIGS. 9, 9A, 9B and at a subsequent fabrication stage, the sacrificial gate structures 22 are removed with one or more etching processes. The sacrificial layers 12 are subsequently removed with an etching process that removes the material of the sacrificial layers 12 selective to the materials of the replacement channel layers 34 and the inner spacers 30.

Gate structures 42 are formed in the spaces opened by the removal of the sacrificial gate structures 22 and sacrificial layers 12 to complete the formation of a field-effect transistor in a replacement gate process. The gate structures 42 may include a gate dielectric layer composed of a dielectric material, such as a high-k dielectric like hafnium oxide and a gate electrode that includes one or more barrier metal layers and/or work function metal layers, such as titanium aluminum carbide or titanium nitride. The gate dielectric layer is arranged between the gate electrode and the replacement channel layers 34.

The replacement channel layers 34 are arranged in a vertical stack with each replacement channel layer 34 wrapped about the side surfaces 39 of one of the mandrels 38. Sections 43 of the gate electrode of each gate structure 42 are located in the spaces formerly occupied by the removed sacrificial layers 12. Each gate electrode section 43 may wrap about a channel region 70 of one of the replacement channel layers 34 and the associated mandrel 38 in a gate-all-around arrangement.

Each replacement channel layer 34 also includes extension regions 72 located at the opposite lateral ends of the channel region 70. The channel region 70 is therefore positioned laterally between the extension regions 72. The extension regions 72 couple opposite ends of the channel region 70 of each replacement channel layer 34 to one of the source/drain contacts 40. The channel region 70 and the extension regions 72 of each replacement channel layer 34 are wrapped (i.e., surround or extend fully about) about all of the side surfaces 39 of one of the mandrels 38. The extension regions 72, as well as the respective lateral portions of the mandrel 38 on which the extension regions 72 are located, extend through the gaps between adjacent inner spacers 30. One of the inner spacers 30 is arranged in a vertical direction between the extension regions 72 of adjacent channel layers 34.

Self-aligned contact caps 44 composed of a dielectric material, such as silicon nitride, are formed in the spaces over each of the gate structures 42 that are between the sidewall spacers 26. The interlayer dielectric layer 41 may be removed to open spaces over the source/drain contacts 40, and trench silicide contacts (not shown) may be formed in these opened spaces that extend to contact the source/drain contacts 40.

Middle-of-line (MOL) and back-end-of-line (BEOL) processing are subsequently used to form an interconnect structure with contacts that are coupled with the field-effect transistor.

The introduction of the two-dimensional material in the replacement channel layer 34 enables the formation of a stacked two-dimensional field-effect transistor characterized by an improved effective width and improved process flexibility. The improvement in process flexibility is enabled at least in part because the two-dimensional material is formed before the formation of the source/drain contacts 40, as well as before the formation of the gate structures 42. The two-dimensional material may therefore be deposited with a more aggressive thermal budget because of a lowered risk of metal interdiffusion and a lowered risk of damage to the gate structures 42. Improved electrostatic control over the replacement channel layers 34, which is enabled by the two-dimensional material, may permit downward scaling of the gate length.

The arrangement of the layer 36 and the source/drain contacts 40 provides a wrap-around-contact (WAC) that may reduce contact resistance. Because the source/drain contacts 40 do not contain an epitaxial semiconductor material as in conventional field-effect transistors, the field-effect transistor including the replacement channel layers of two-dimensional material is junction-less. Either n-type or p-type field-effect transistors may be formed by adjusting the doping of the two-dimensional material in layer 36 and the metal used to form the source/drain contacts 40.

Figure 11:
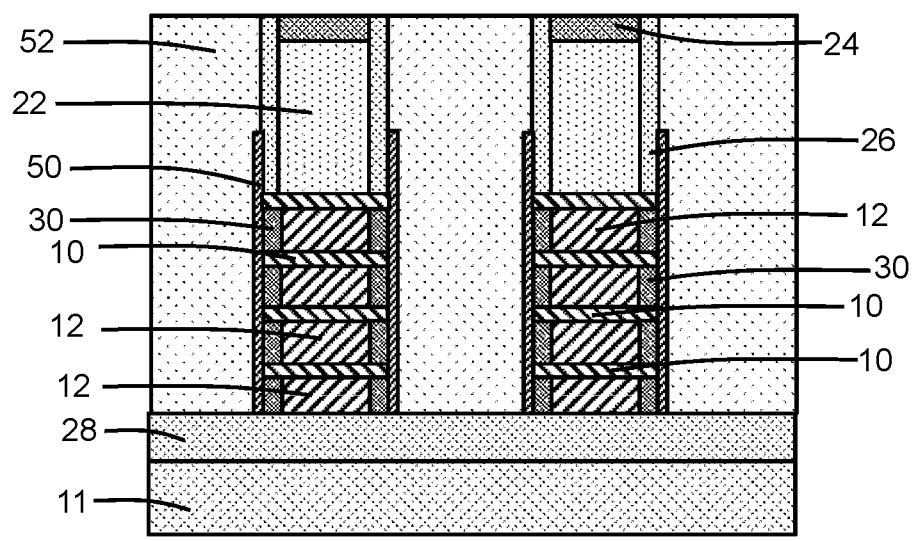
FIGS. 11-16, 11A-16A, and 11B-16B are cross-sectional views of the device structure at successive fabrication stages of a processing method in accordance with alternative embodiments.
Figure 11A:
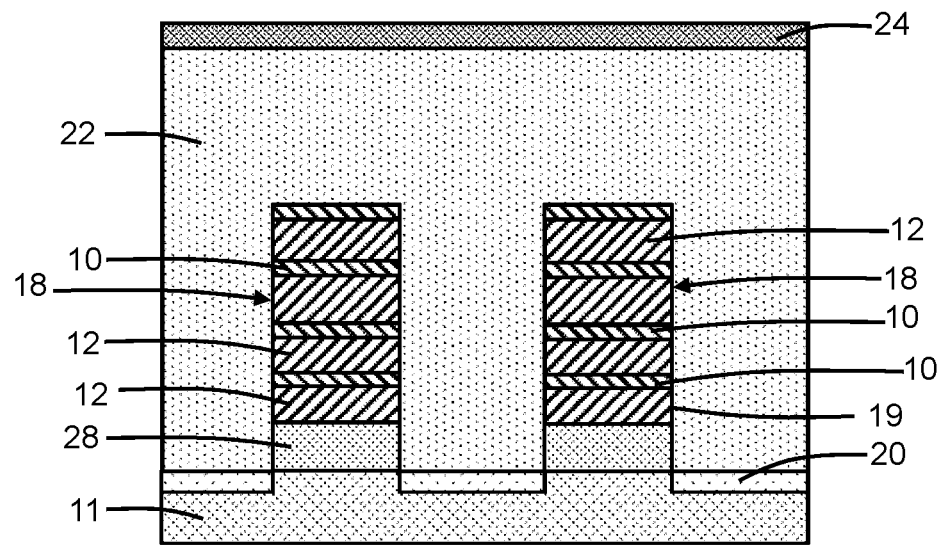
Figure 11B:
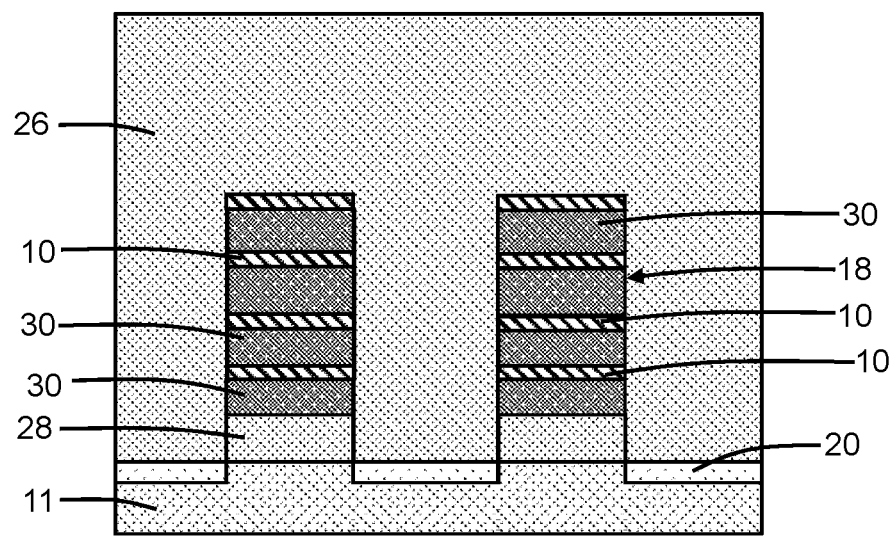

With reference to FIGS. 11, 11A, 11B in which like reference numerals refer to like features in FIGS. 4, 4A, 4B and in accordance with alternative embodiment, the nanosheet channel layers 10 may be formed in the layer stack with a reduced thickness. Spacers 50 may be formed adjacent to the sidewalls of the fins 18. The spacers 50 may be formed by depositing a conformal layer composed of a dielectric material, such as titanium oxide, and etching the deposited conformal layer with an anisotropic etching process, such as reactive ion etching. An interlayer dielectric layer 52 is deposited and planarized to fill the spaces between the fins 18 and sacrificial gate structures 22. The interlayer dielectric layer 52 may be composed of a dielectric material, such as silicon dioxide, deposited by chemical vapor deposition and may be planarized by chemical-mechanical polishing. The planarization may remove the hardmask caps 24 to open the sacrificial gate structures 22.

Figure 12:
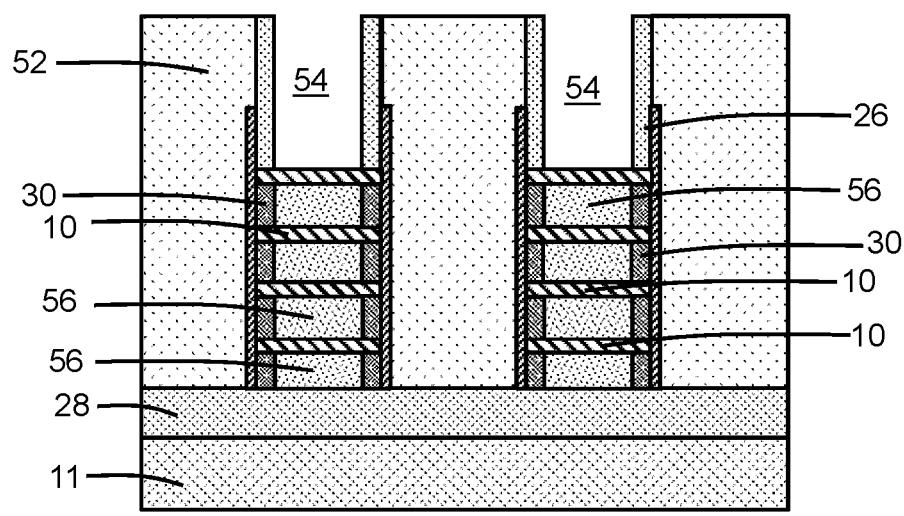
Figure 12A:
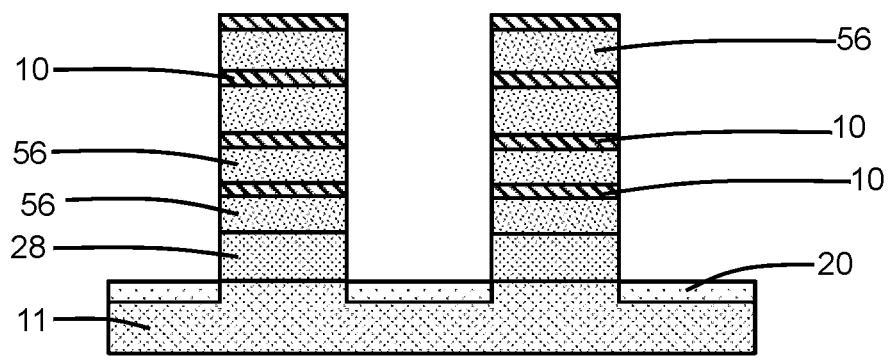
Figure 12B:
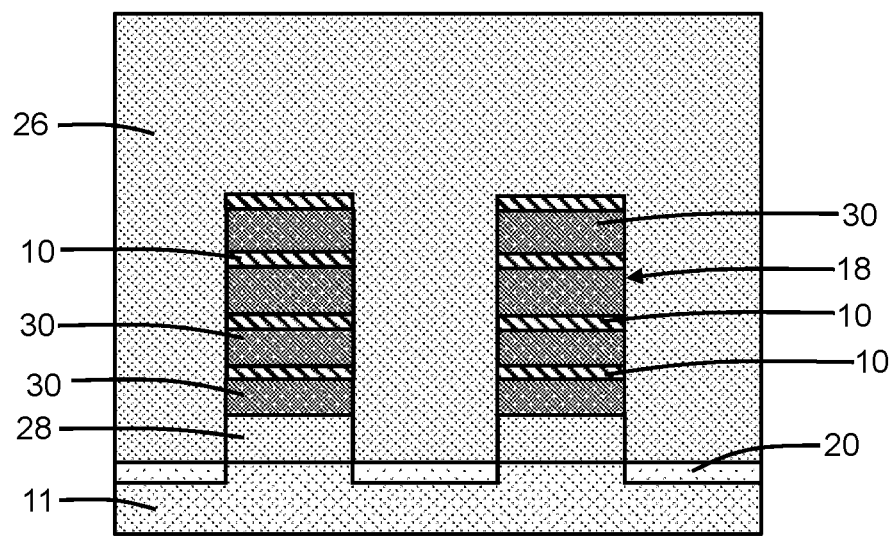

With reference to FIGS. 12, 12A, 12B in which like reference numerals refer to like features in FIGS. 11, 11A, 11B and at a subsequent fabrication stage, the sacrificial gate structures 22 are removed with one or more etching processes to define spaces 54. The sacrificial layers 12 are subsequently removed with an etching process that removes the material of the sacrificial layers 12 selective to the materials of the replacement channel layers 34 and the inner spacers 30.

Mandrels 56 are formed that fill the spaces vacated by the removed sacrificial layers 12. The mandrels 56 may be composed of a low-k dielectric material, such as SiBCN, SiOC, or SiOCN, conformally deposited as layer by atomic layer deposition and etched with an isotropic etching process to remove portions of the layer external to the spaces. The deposited layer may pinch-off inside the spaces to form the mandrels 56. The interlayer dielectric layer 52 blocks the deposition of the layer between the sacrificial gate structures 22. Each mandrel 56 includes opposite end surfaces 57 that are spaced in a lateral direction relative to each other and side surfaces 59 that are positioned between the opposite end surfaces. The end surfaces 57 and side surfaces 59 are similar to the end surfaces 37 and side surfaces 39 of the mandrels 38 as previously described.

Figure 13:
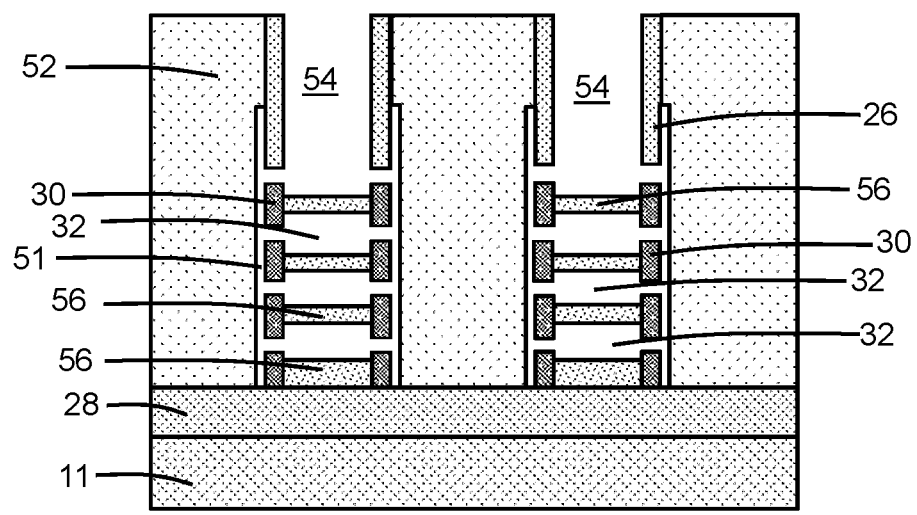
Figure 13A:
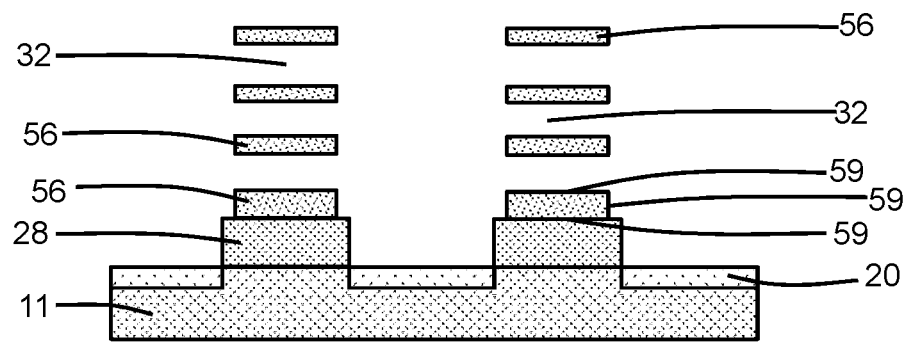
Figure 13B:
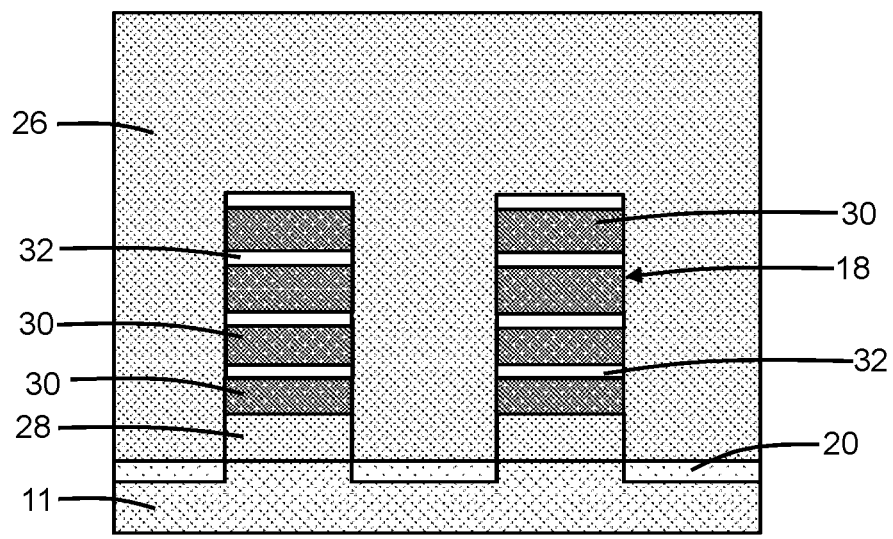

With reference to FIGS. 13, 13A, 13B in which like reference numerals refer to like features in FIGS. 12, 12A, 12B and at a subsequent fabrication stage, the nanosheet channel layers 10 are fully removed as previously described with an etching process to form the spaces 32 that extend across the full width of the fins 18 and sidewall spacers 26. The mandrels 56 are then thinned with an isotropic etching process, which also removes the spacers 50 to define spaces 51 that are in communication with the spaces 32.

Figure 14:
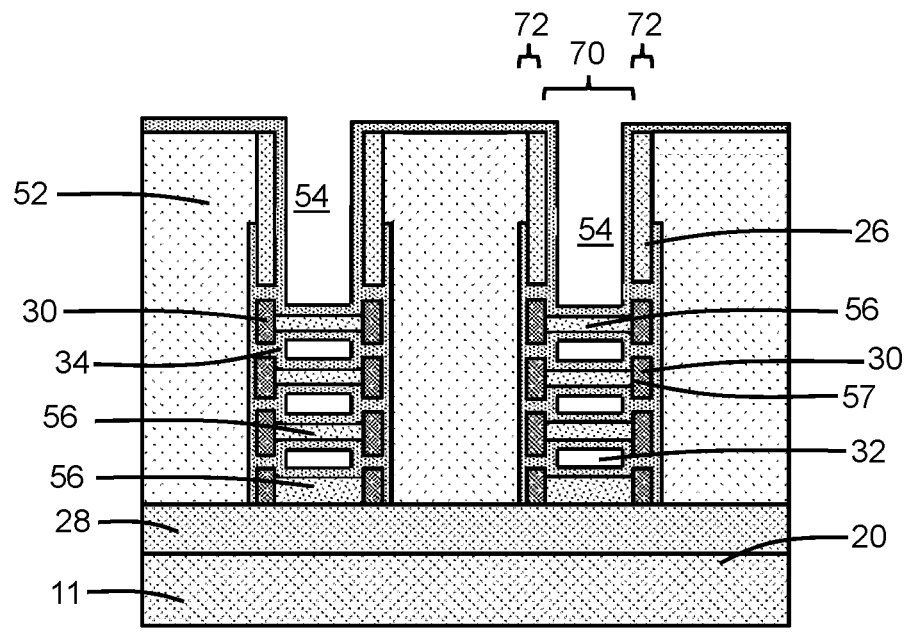
Figure 14A:
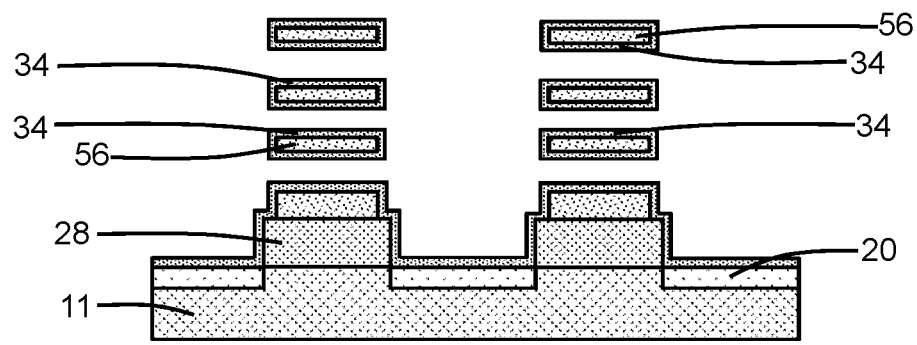
Figure 14B:
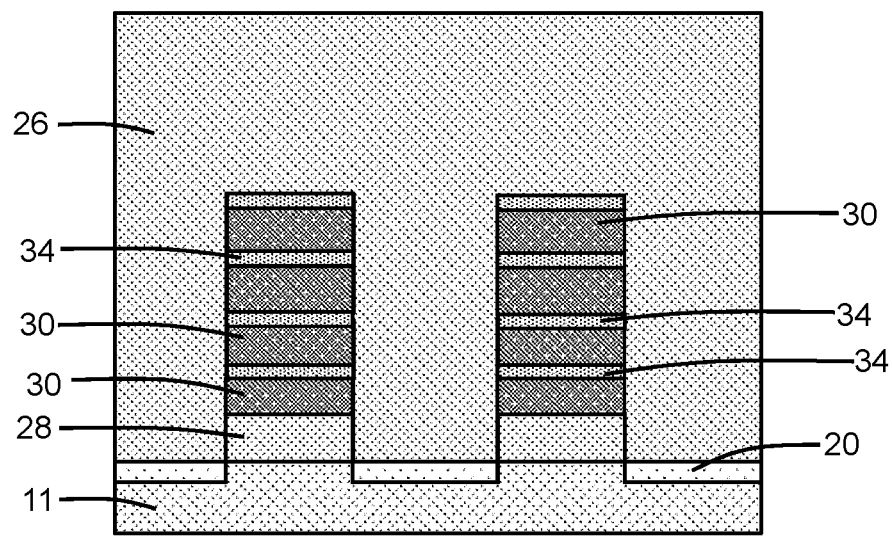

With reference to FIGS. 14, 14A, 14B in which like reference numerals refer to like features in FIGS. 13, 13A, 13B and at a subsequent fabrication stage, the replacement channel layers 34 and the layer 36 composed of two-dimensional material are formed as previously described. In the alternative embodiment, the mandrels 56 are formed before the replacement channel layers 34 and layer 36 are formed, and the replacement channel layers 34 are formed on the exterior surfaces of the mandrels 56 and inner spacers 30. The relationship between the replacement channel layers 34 and the side surfaces 59 of the mandrels 56 are similar to the relationship between the replacement channel layers 34 and the side surfaces 39 of the mandrels 38 as previously described. However, the extension regions 72 of the replacement channel layers 34 do not surround the mandrels 56. Instead, the extension regions 72 of the replacement channel layers 34 are short segments that fully fill the spaces 32 formed between the inner spacers 30 by the removal of the nanosheet channel layers 10 and the spaces 51. The opposite end surfaces 57 of each mandrel 56 terminate at, and directly contact, one of the inner spacers 30.

Figure 15:
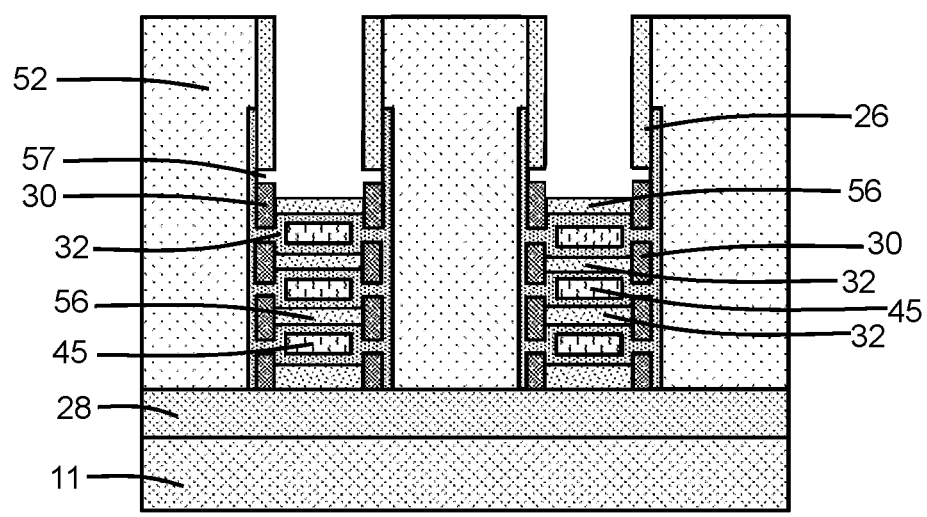
Figure 15A:
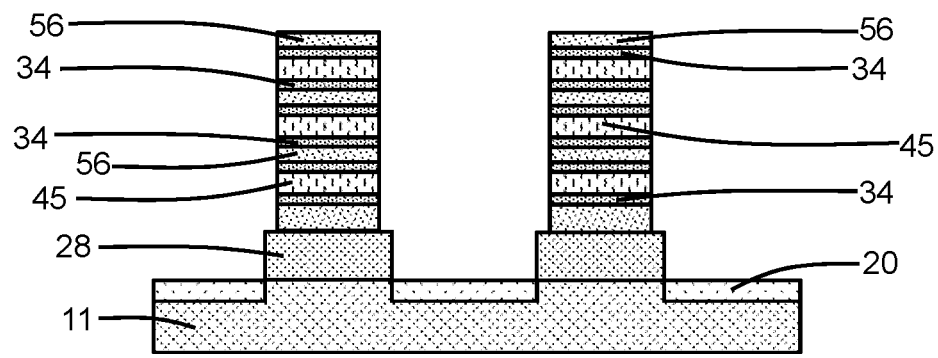
Figure 15B:
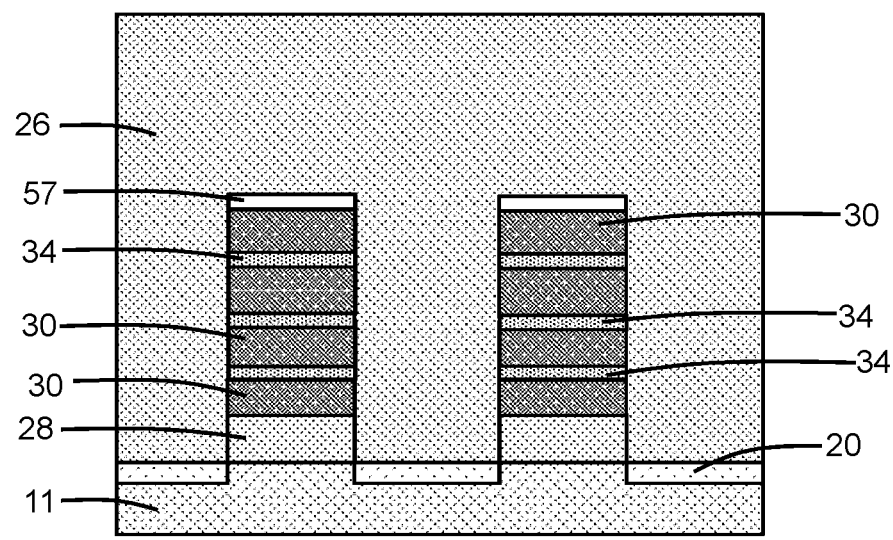

With reference to FIGS. 15, 15A, 15B in which like reference numerals refer to like features in FIGS. 14, 14A, 14B and at a subsequent fabrication stage, composite plugs 45 are formed in the spaces 32 between the mandrels 56 and may be in direct contact with the replacement channel layers 34. The composite plugs 45 may include the conformally-deposited gate dielectric layer of the gate structures 42, a capping layer composed of, for example, titanium nitride, and a central core composed of, for example, p-type polysilicon. With the composite plugs 42 present, an anneal may be performed to improve the physical properties and reliability of the gate dielectric layer.

Portions of the two-dimensional material of layer 36 are exposed in the space over the topmost mandrel 56 and are removed with an etching process. The removal of these exposed portions of the two-dimensional material of layer 36 defines a recess 57 over each of the topmost inner spacers 30. The composite plugs 42 protect the replacement channel layers 34 during the formation of the recesses 57.

Figure 16:
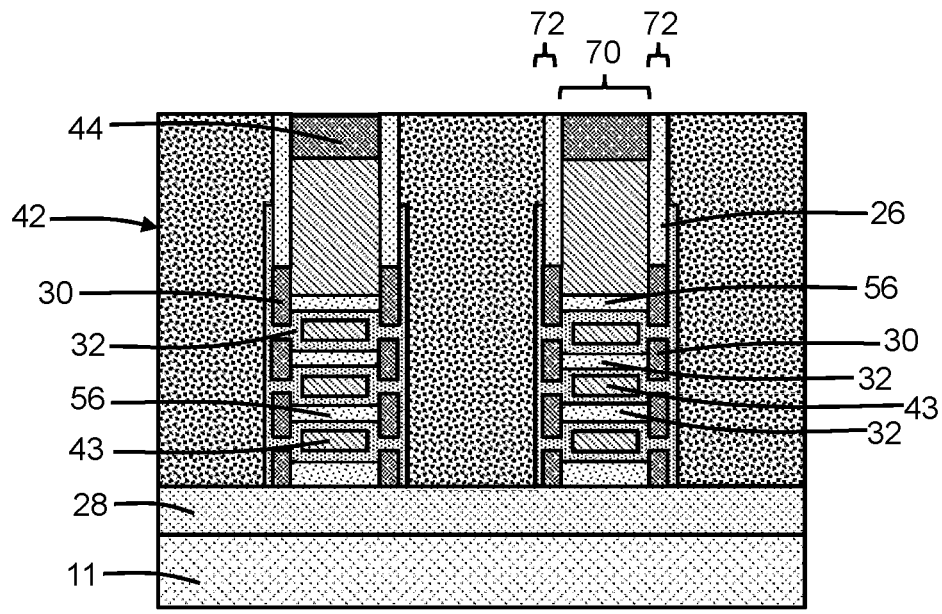
Figure 16A:
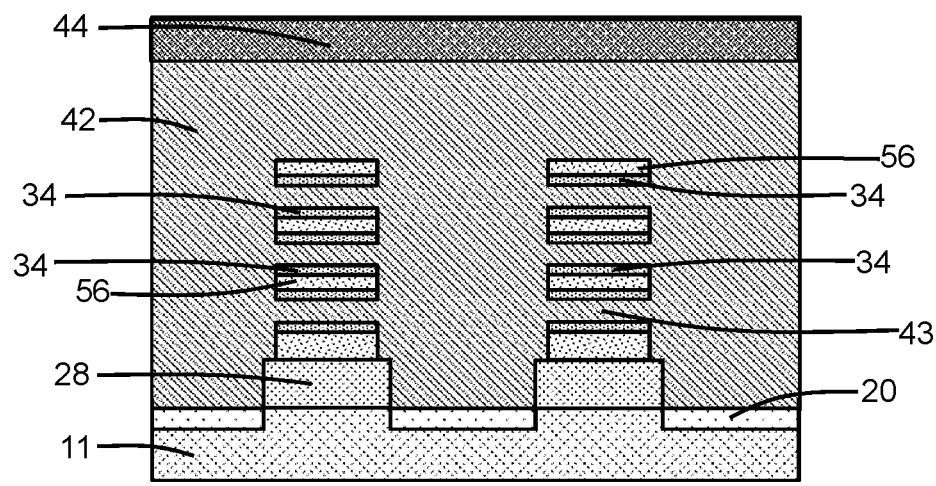
Figure 16B:
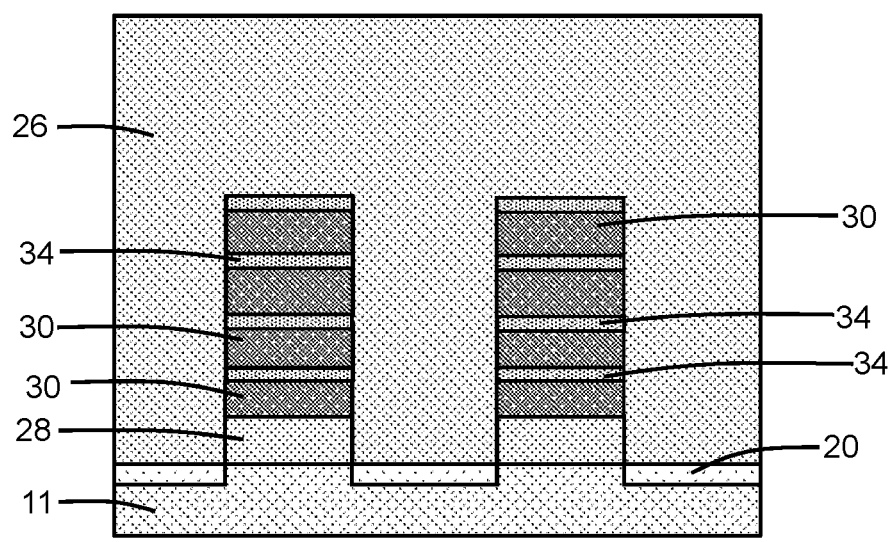

With reference to FIGS. 16, 16A, 16B in which like reference numerals refer to like features in FIGS. 15, 15A, 15B and at a subsequent fabrication stage, the recesses 57 over the topmost inner spacers 30 are filled with a dielectric material, which may be the same dielectric material (e.g., silicon nitride) constituting the inner spacers 30. The capping layer and central core of the composite plugs 45 are subsequently removed with an etching process leaving behind the gate dielectric layer of the gate structures 42. The gate electrodes of the gate structures 42 are formed as previously described. The gate electrode sections 43 of each gate structure 42 are positioned in the spaces between the mandrels 56 and wrap about the channel regions 70 of the replacement channel layers 34 and the associated mandrels 56. The gate electrodes of the gate structures 42 and the self-aligned contact caps 44 are then formed.

The interlayer dielectric layer 52 is removed, which exposes the layer 36. The two-dimensional material in the layer 36 may then be doped, as previously described, to increase its electrical conductivity. The source/drain contacts 40, which are coupled by the layer 36 with the extension regions of the replacement channel layers 34, are then formed in the recesses 25.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. The chip may be integrated with other chips, discrete circuit elements, and/or other signal processing devices as part of either an intermediate product or an end product. The end product can be any product that includes integrated circuit chips, such as computer products having a central processor or smartphones.

References herein to terms modified by language of approximation, such as "about", "approximately", and "substantially", are not to be limited to the precise value specified. The language of approximation may correspond to the precision of an instrument used to measure the value and, unless otherwise dependent on the precision of the instrument, may indicate +/−10% of the stated value(s).

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refer to a direction perpendicular to the horizontal, as just defined. The term "lateral" refers to a direction within the horizontal plane.

A feature "connected" or "coupled" to or with another feature may be directly connected or coupled to or with the other feature or, instead, one or more intervening features may be present. A feature may be "directly connected" or "directly coupled" to or with another feature if intervening features are absent. A feature may be "indirectly connected" or "indirectly coupled" to or with another feature if at least one intervening feature is present. A feature "on" or "contacting" another feature may be directly on or in direct contact with the other feature or, instead, one or more intervening features may be present. A feature may be "directly on" or in "direct contact" with another feature if intervening features are absent. A feature may be "indirectly on" or in "indirect contact" with another feature if at least one intervening feature is present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure for a field-effect transistor, the structure comprising:
   a first mandrel comprised of a dielectric material, the first mandrel including a first side surface and a second side surface;
   a second mandrel comprised of the dielectric material, the second mandrel including a side surface, and the second mandrel arranged over the first mandrel;
   a gate electrode having a section wrapped about the first side surface and the second side surface of the first mandrel;
   a first channel layer including a channel region, the channel region of the first channel layer positioned in part between the first side surface of the first mandrel and the section of the gate electrode; and
   a second channel layer including a channel region positioned in part between the side surface of the second mandrel and the section of the gate electrode,
   wherein the first channel layer and the second channel layer are comprised of a two-dimensional material.

2. The structure of claim 1 wherein the channel region of the first channel layer is positioned in part between the second side surface of the first mandrel and the section of the gate electrode.

3. The structure of claim 2 wherein the first side surface and the second side surface of the first mandrel are contained in respective planes that are substantially parallel.

4. The structure of claim 1 wherein the first side surface and the second side surface are included in a plurality of side surfaces of the first channel layer, and the channel region of the first channel layer extends about all of the side surfaces of the first mandrel.

5. The structure of claim 1 wherein the first channel layer includes an extension region, the second channel layer includes an extension region, and further comprising:
a source/drain contact connected by the extension region of the first channel layer to the channel region of the first channel layer and connected by the extension region of the second channel layer to the channel region of the second channel layer.

6. The structure of claim 5 wherein the first mandrel and the second mandrel each terminate at the source/drain contact in direct contact with the source/drain contact, the extension region of the first channel layer extends fully about the first mandrel, and the extension region of the second channel layer extends fully about the second mandrel.

7. The structure of claim 6 further comprising:
an inner spacer positioned in a first direction between the section of the gate electrode and the source/drain contact,
wherein the inner spacer is positioned in a second direction between the extension region of the first channel layer and the extension region of the second channel layer.

8. The structure of claim 1 wherein the two-dimensional material is a transition metal dichalcogenide.

9. The structure of claim 1 wherein the two-dimensional material is molybdenum disulphide, hafnium disulfide, zirconium disulfide, tungsten disulfide, tin sulfide, or tungsten diselenide.

10. A structure for a field-effect transistor, the structure comprising:
a mandrel comprised of a dielectric material, the mandrel including a first side surface and a second side surface;
a gate electrode having a section wrapped about the first side surface and the second side surface of the mandrel;
a first channel layer including a first extension region and a channel region, the channel region of the first channel layer positioned in part between the first side surface of the mandrel and the section of the gate electrode;
a first source/drain contact connected by the first extension region of the first channel layer with the channel region of the first channel layer; and
a first inner spacer and a second inner spacer positioned in a first direction between the section of the gate electrode and the first source/drain contact,
wherein the first channel layer is comprised of a two-dimensional material, the first extension region is positioned in a second direction between the first inner spacer and the second inner spacer, and the first mandrel terminates at the first inner spacer and the second inner spacer.

11. The structure of claim 10 wherein the first channel layer includes a second extension region, the channel region of the first channel layer is positioned between the first extension region and the second extension region of the first channel layer, and further comprising:
a second source/drain contact connected by the second extension region of the first channel layer to the channel region of the first channel layer.

12. The structure of claim 11 wherein the first side surface and the second side surface are included in a plurality of side surfaces, and the channel region, the first extension region, and the second extension region of the first channel layer extend about all of the side surfaces of the mandrel.

13. The structure of claim 10 further comprising:
a layer of the two-dimensional material coupling the first extension region of the first channel layer to the first source/drain contact.

14. The structure of claim 13 wherein the layer of the two-dimensional material contains a dopant effective to increase an electrical conductivity of the two-dimensional material.

15. The structure of claim 10 wherein the two-dimensional material is a transition metal dichalcogenide.

16. The structure of claim 10 wherein the two-dimensional material is molybdenum disulphide, hafnium disulfide, zirconium disulfide, tungsten disulfide, tin sulfide, or tungsten diselenide.

17. A method of forming a field-effect transistor, the method comprising:
forming a first channel layer including a channel region;
forming a first dielectric mandrel that includes a first side surface and a second side surface;
forming a second dielectric mandrel that includes a side surface and that is arranged over the first dielectric mandrel;
forming a gate electrode that has a section wrapped about the first side surface and the second side surface of the first dielectric mandrel; and
forming a second channel layer including a channel region positioned in part between the side surface of the second dielectric mandrel and the section of the gate electrode,
wherein the channel region of the first channel layer is positioned in part between the first side surface of the first dielectric mandrel and the section of the gate electrode, and the first channel layer and the second channel layer are comprised of a two-dimensional material.

18. The method of claim 17 wherein the first channel layer and the second channel layer are formed before the first dielectric mandrel and the second dielectric mandrel are formed.

19. The method of claim 17 wherein the first channel layer and the second channel layer are formed after the first dielectric mandrel and the second dielectric mandrel are formed.

20. The method of claim 17 wherein the first side surface and the second side surface are included in a plurality of side surfaces of the first channel layer, and the channel region of the first channel layer extends about all of the side surfaces of the first dielectric mandrel.

* * * * *